United States Patent
Kyoukane et al.

(10) Patent No.: US 11,105,972 B2
(45) Date of Patent: Aug. 31, 2021

(54) LIGHT-EMITTING DEVICE, LIGHTING DEVICE, AND DISPLAY DEVICE

(71) Applicant: Sharp Kabushiki Kaisha, Sakai (JP)

(72) Inventors: Youzou Kyoukane, Sakai (JP); Hisashi Watanabe, Sakai (JP); Hirotoshi Yasunaga, Sakai (JP); Ryuzo Yuki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 513 days.

(21) Appl. No.: 16/305,418

(22) PCT Filed: Aug. 7, 2017

(86) PCT No.: PCT/JP2017/028564
§ 371 (c)(1),
(2) Date: Nov. 29, 2018

(87) PCT Pub. No.: WO2018/030333
PCT Pub. Date: Feb. 15, 2018

(65) Prior Publication Data
US 2020/0326470 A1 Oct. 15, 2020

(30) Foreign Application Priority Data

Aug. 12, 2016 (JP) .............................. JP2016-158960

(51) Int. Cl.
*F21V 8/00* (2006.01)
*H05K 1/02* (2006.01)

(52) U.S. Cl.
CPC ......... *G02B 6/0091* (2013.01); *G02B 6/0055* (2013.01); *G02B 6/0068* (2013.01); *H05K 1/028* (2013.01); *H05K 2201/10106* (2013.01)

(58) Field of Classification Search
CPC .......................... G02B 6/0045; G02B 6/0081
See application file for complete search history.

(56) References Cited

U.S. PATENT DOCUMENTS

2008/0239747 A1  10/2008 Ito et al.
2011/0242448 A1  10/2011 Oohira
(Continued)

FOREIGN PATENT DOCUMENTS

JP  2008-218218 A  9/2008
JP  2008-244985 A  10/2008
(Continued)

OTHER PUBLICATIONS

Official Communication issued in International Patent Application No. PCT/JP2017/028564, dated Oct. 31, 2017.

*Primary Examiner* — William J Carter
(74) *Attorney, Agent, or Firm* — Keating & Bennett, LLP

(57) ABSTRACT

The light input efficiency of a light-emitting device into a circular disc-shaped or elliptical disc-shaped light guide plate is increased. A light-emitting device includes a first light-emitting unit (12*a*) that includes a plurality of light-emitting elements (L1 to L5) arranged curvilinearly, a second light-emitting unit (12*b*) that includes a plurality of light-emitting elements (L6 to L10) arranged curvilinearly, and a coupling portion (12*c*) that is disposed so as to coincide with a region (SA) sandwiched by the first and second light-emitting units and couples the first and second light-emitting units.

21 Claims, 8 Drawing Sheets

(56) References Cited

U.S. PATENT DOCUMENTS

| | | | |
|---|---|---|---|
| 2012/0106198 A1 | 5/2012 | Lin et al. | |
| 2017/0242182 A1* | 8/2017 | Diana | G02B 6/0055 |
| 2017/0351143 A1* | 12/2017 | Kadowaki | G02B 6/0068 |
| 2018/0259701 A1* | 9/2018 | Yuki | G02B 6/0055 |

FOREIGN PATENT DOCUMENTS

| | | | |
|---|---|---|---|
| JP | 2009-069768 A | 4/2009 | |
| JP | 2011-209602 A | 10/2011 | |
| JP | 2012-094514 A | 5/2012 | |
| WO | 2016/104357 A1 | 6/2016 | |
| WO | WO-2016104357 A1 * | 6/2016 | G02B 6/0081 |
| WO | WO-2016104363 A1 * | 6/2016 | G02F 1/133512 |

* cited by examiner (a)

(b)

(a)

(b)

LIGHT-EMITTING DEVICE, LIGHTING DEVICE, AND DISPLAY DEVICE

TECHNICAL FIELD

The present invention relates to a light-emitting device to be used in a display device.

BACKGROUND ART

PTL 1 discloses a liquid-crystal display device provided with a circular display area.

CITATION LIST

Patent Literature

PTL 1: Japanese Unexamined Patent Application Publication No. 2009-69768 (published on Apr. 2, 2009)

SUMMARY OF INVENTION

Technical Problem

In a display device in which a lighting device is used, light from a light-emitting element is applied to a display area via a light guide plate. When the display area has a closed curved outer periphery (e.g., circle or ellipse) and the light guide plate has a shape that corresponds to the shape of the display area (e.g., disc shape or elliptical disc shape), a problem arises in that the light-emitting element is spaced apart from an edge of the light guide plate and the light input efficiency from the light-emitting element into the light guide plate decreases.

Solution to Problem

A light-emitting device according to one aspect of the present invention includes a first light-emitting unit that includes a plurality of light-emitting elements arranged curvilinearly, a second light-emitting unit that includes a plurality of light-emitting elements arranged curvilinearly, and a coupling portion that is disposed so as to coincide with a region sandwiched by the first and second light-emitting units and couples the first and second light-emitting units.

Advantageous Effects of Invention

When the light-emitting device according to one aspect of the present invention is fixed to a light guide plate having, for example, a disc shape or an elliptical disc shape, the distance from each light-emitting element to an edge of the light guide plate is reduced, and the light input efficiency from the light-emitting elements into the light guide plate is increased.

DESCRIPTION OF EMBODIMENTS

With reference to FIG. 1 to FIG. 8, embodiments of the present invention will be described, hereinafter. In the following descriptions, a display surface side of a liquid-crystal display device is regarded as an upper side (for a light guide plate, a light-exit surface side is regarded as an upper side).

First Embodiment

Figure 1:
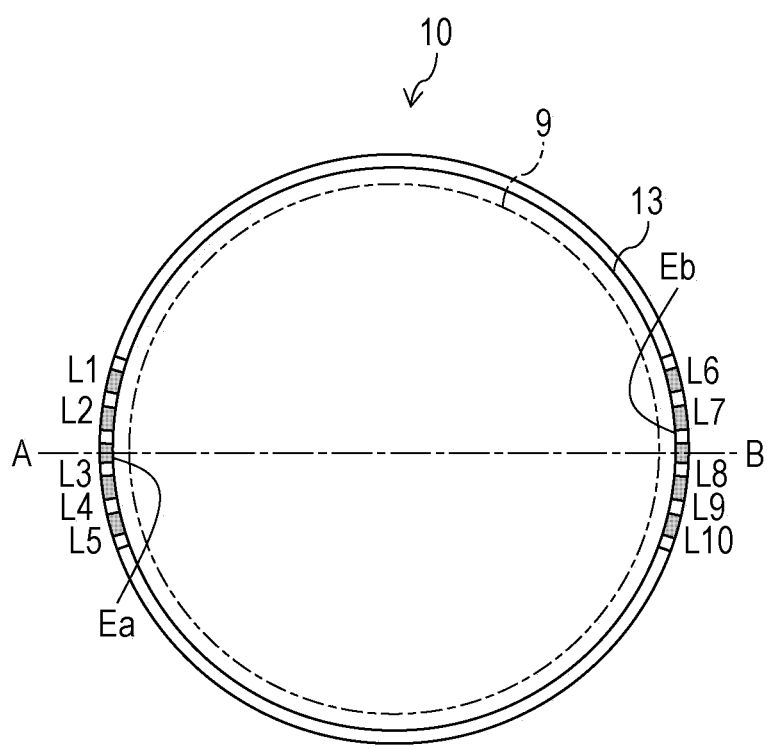
FIG. 1 is a top view illustrating a configuration of a liquid-crystal display device according to a first embodiment.

FIG. 1 is a top view of a liquid-crystal display device according to a first embodiment. As illustrated in FIG. 1, a liquid-crystal display device 10 includes a display unit 9 that is circular as viewed from the above, and a disc-shaped light guide plate 13 is provided underneath the display unit 9. Light-emitting elements L1 to L5 are provided along a portion Ea of an edge of the light guide plate 13, and light-emitting elements L6 to L10 are provided along another portion Eb of the edge opposite to the portion Ea across a center of the light guide plate.

The display unit 9 is constituted by a liquid-crystal panel and provided with scan signal lines, data signal lines, and pixels connected to the data signal lines and the scan signal lines via transistors. Light from the light-emitting elements is applied to the pixels via the light guide plate provided underneath the display unit 9, and the amount of transmitted light is controlled by liquid-crystal layers within the pixels.

Specifically, the transmittance of each liquid-crystal layer is controlled by a data signal written into a pixel electrode within the pixel from the data signal line via the transistor. In the liquid-crystal display device 10, a source driver that drives the data signal lines and a gate driver that drives the scan signal lines are provided outside the display unit 9.

FIG. 2(a) is an A-B sectional view of the liquid-crystal display device illustrated in FIG. 1, FIG. 2(b) is a top view of a light-emitting device provided in the liquid-crystal display device illustrated in FIG. 1, and FIG. 2(c) is a top perspective view of the light-emitting device and the light guide plate provided in the liquid-crystal display device illustrated in FIG. 1.

As illustrated in FIG. 2(a), the liquid-crystal display device 10 includes a liquid-crystal panel 3 and a lighting device 5 disposed underneath (on the back surface of) the liquid-crystal panel 3.

The liquid-crystal panel 3 is disc-shaped and includes an active-matrix substrate that includes the data signal lines, the scan signal lines, the transistors, and the pixel electrodes; a counter substrate that includes color filters and counter electrodes; and a liquid-crystal layer disposed between the active-matrix substrate and the counter substrate. A touch panel and a cover glass that are circular like the liquid-crystal panel 3 are provided over the liquid-crystal panel 3.

The lighting device 5 is an edge-type backlight and includes an optical member 4, the light guide plate 13, a light-emitting device 12, and a light-reflecting sheet 14. The optical member 4 is provided between the liquid-crystal panel 3 and the light guide plate 13 and includes two prism sheets each having grooves that are substantially orthogonal to each other and a diffusion sheet provided in this order from the side where the liquid-crystal panel is provided. The light guide plate 13 is composed of polycarbonate or acrylic resin and formed into a disc shape. The light-emitting device 12 includes a continuous flexible printed board in which the light-emitting elements (L1 to L10) of a sideview emission type (a configuration in which a side surface serves as an emission surface) are mounted. The flexible printed board is connected to a power source substrate and applies a predetermined voltage to each light-emitting element to cause the light-emitting element to emit light.

As illustrated in FIGS. 2(a) and 2(b), the light-emitting device 12 includes a first light-emitting unit 12a, a second light-emitting unit 12b, a coupling portion 12c, and a connection terminal portion 12t. The coupling portion 12c is disposed so as to coincide with a region SA sandwiched by the first light-emitting unit 12a and the second light-emitting unit 12b and couples the first light-emitting unit 12a and the second light-emitting unit 12b.

The first light-emitting unit 12a includes a curved flexible printed circuit Fa that projects in a first direction (the left direction in the drawings), and the five light-emitting elements L1 to L5 are mounted on the projecting side (the side farther from the coupling portion) of the flexible printed circuit Fa in a circular arc shape that projects in the first direction. The second light-emitting unit 12b includes a curved flexible printed circuit Fb that projects in a second direction (the right direction in the drawings) opposite to the first direction, and the five light-emitting elements L6 to L10 are mounted on the projecting side (the side farther from the coupling portion) of the flexible printed circuit Fb in a circular arc shape that projects in the second direction. The number of the light-emitting elements herein is an example, and the number may be selected in accordance with the characteristics or the like of the light-emitting elements and the liquid-crystal panel.

As illustrated in FIG. 2(b), in the light-emitting device 12 according to the first embodiment, each of the first and second light-emitting units 12a and 12b is curved so as to project away from the coupling portion. The light-emitting elements L1 to L5 of the first light-emitting unit 12a are arranged in a circular arc shape so as to project away from the coupling portion, and the light-emitting elements L6 to L10 of the second light-emitting unit 12b are arranged in a circular arc shape so as to project away from the coupling portion.

The coupling portion 12c is an elongated (belt-shaped) flexible printed circuit and mechanically and electrically couples the flexible printed circuit Fa and the flexible printed circuit Fb. The connection terminal portion 12t is a flexible printed circuit pulled out from the coupling portion 12c. The flexible printed circuit Fa, the flexible printed circuit Fb, the coupling portion 12c, and the connection terminal portion 12t are continuous. The connection terminal portion 12t is pulled out from a mid portion of the coupling portion 12c, but this is not a limiting example.

In the light-emitting device 12, each light-emitting element includes, for example, an LED (light-emitting diode). The light-emitting elements L1 to L5 connected in series in the first light-emitting unit 12a are connected to the connection terminal portion 12t via the coupling portion 12c, and the light-emitting elements L6 to L10 connected in series in the second light-emitting unit 12b are connected to the connection terminal portion 12t via the coupling portion 12c.

Figure 2:
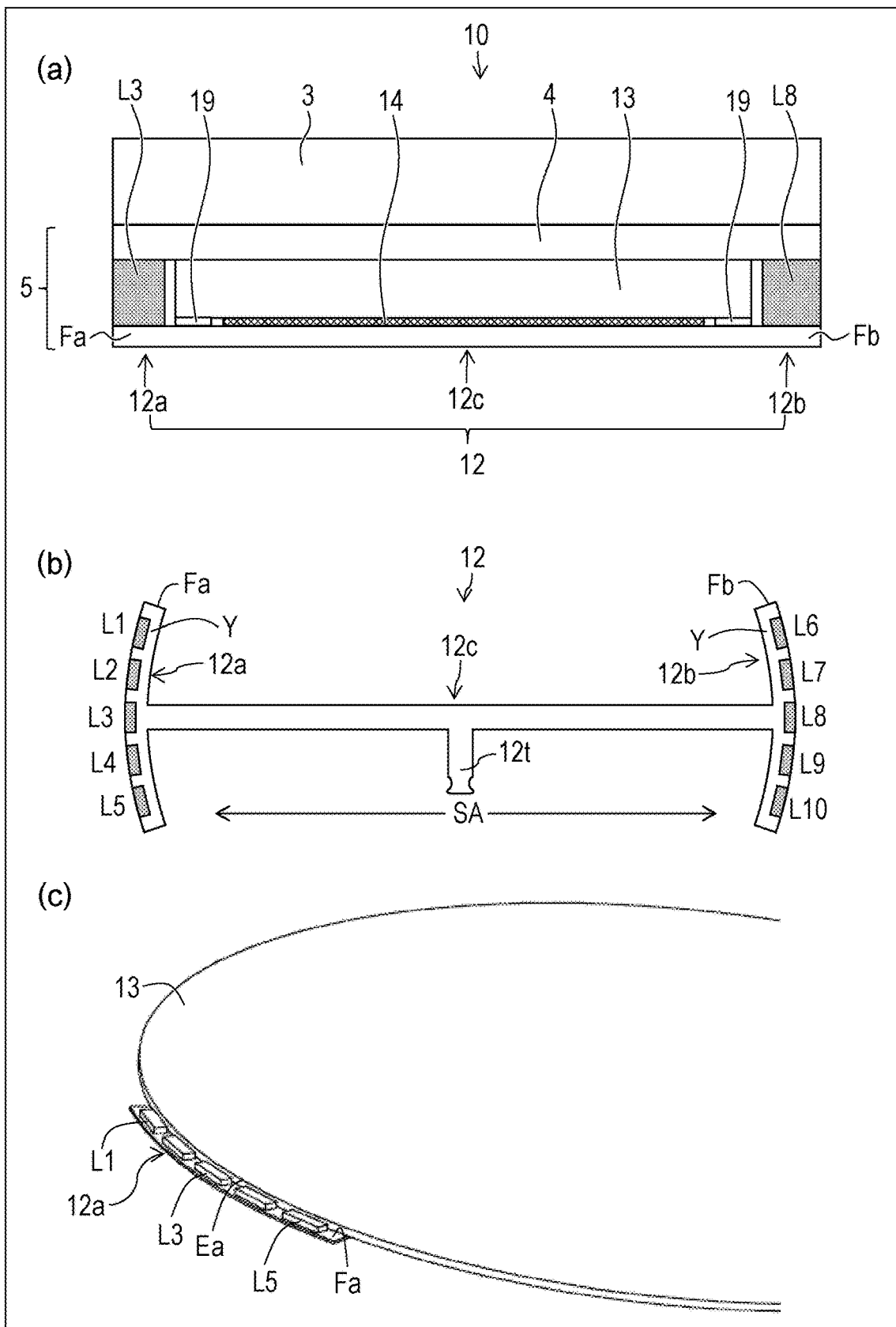
FIG. 2(a) is a sectional view illustrating a configuration of the liquid-crystal display device according to the first embodiment.
FIG. 2(b) is a top view illustrating a configuration of a light-emitting device illustrated in FIG. 2(a)
FIG. 2(c) is a perspective view illustrating a relationship between the light-emitting device and a light guide plate illustrated in FIG. 2(a).
Figure 3:
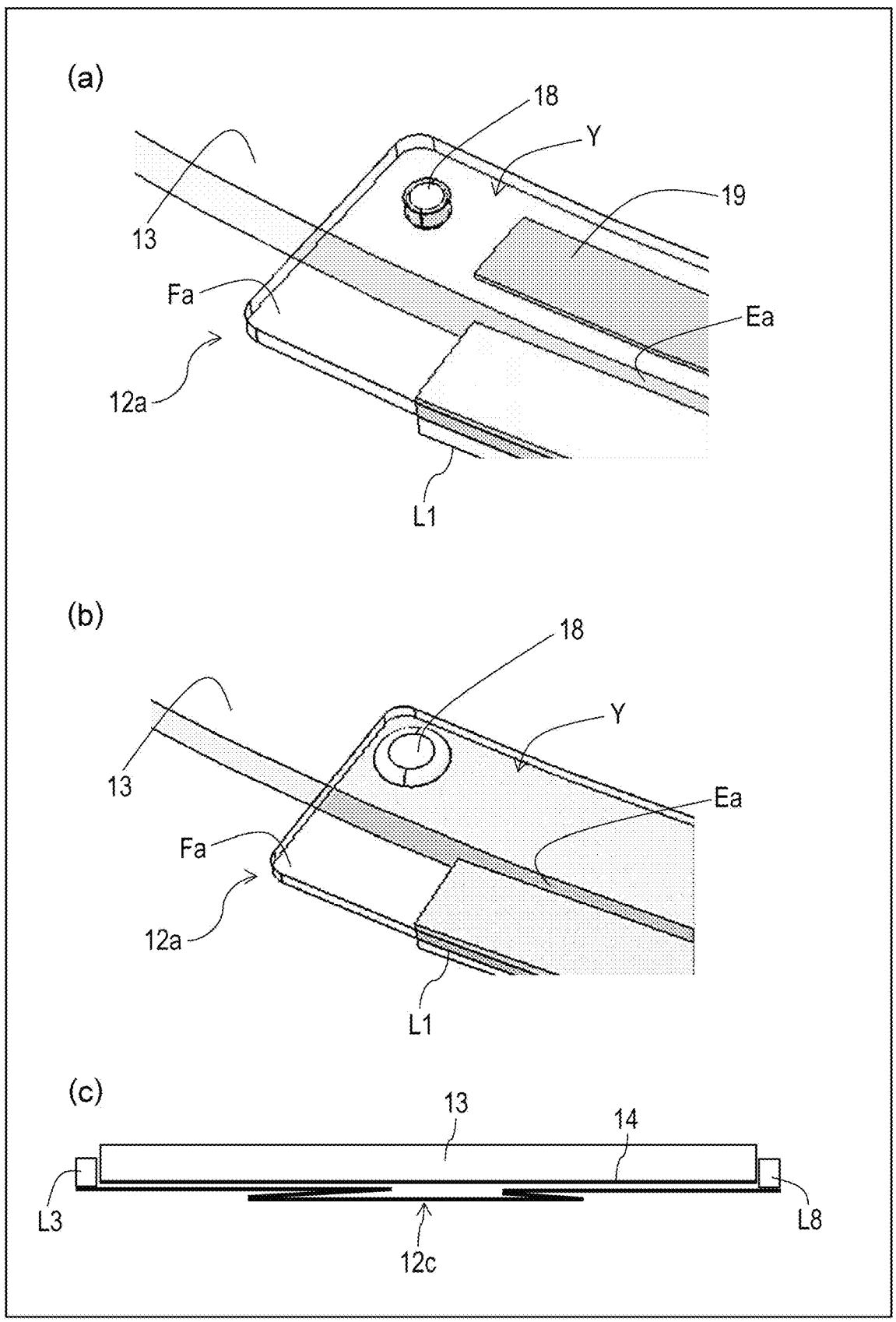
FIG. 3(a) is a bottom perspective view illustrating a technique for aligning the light guide plate and the light-emitting device according to the first embodiment.
FIG. 3(b) is a bottom perspective view for describing a technique for fixing the light guide plate and the light-emitting device according to the first embodiment.
FIG. 3(c) is a sectional view for describing an example of attaching the light-emitting device to the light guide plate according to the first embodiment.
Figure 4:
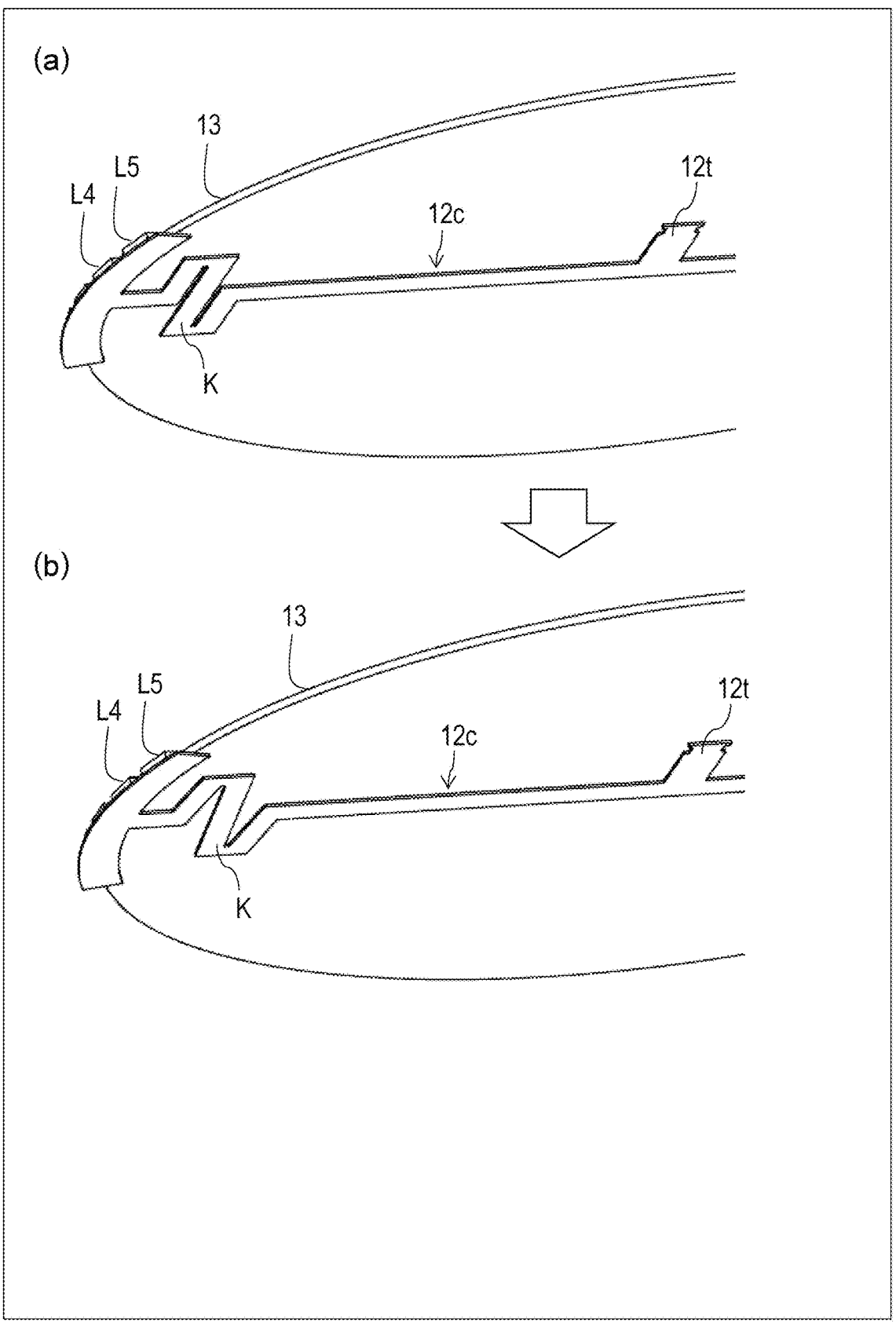
FIGS. 4(a) and 4(b) are bottom perspective views illustrating another configuration of the light-emitting device according to the first embodiment.
Figure 5:
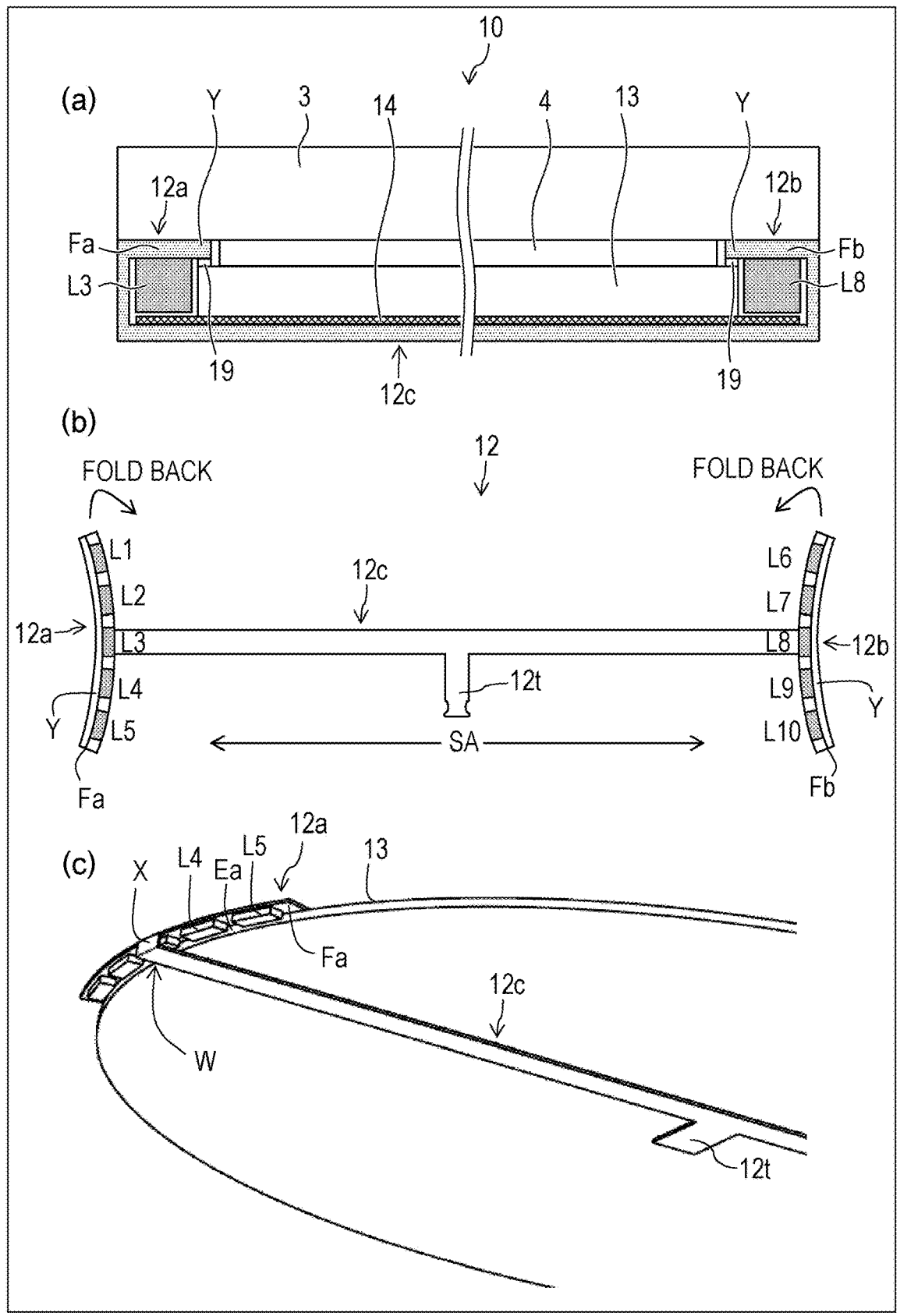
FIG. 5(a) is a sectional view of a liquid-crystal display device according to a second embodiment.
FIG. 5(b) is a top view of a light-emitting device according to the second embodiment.
FIG. 5(c) is a bottom perspective view illustrating an example of attaching the light-emitting device to a light guide plate according to the second embodiment.
Figure 6:
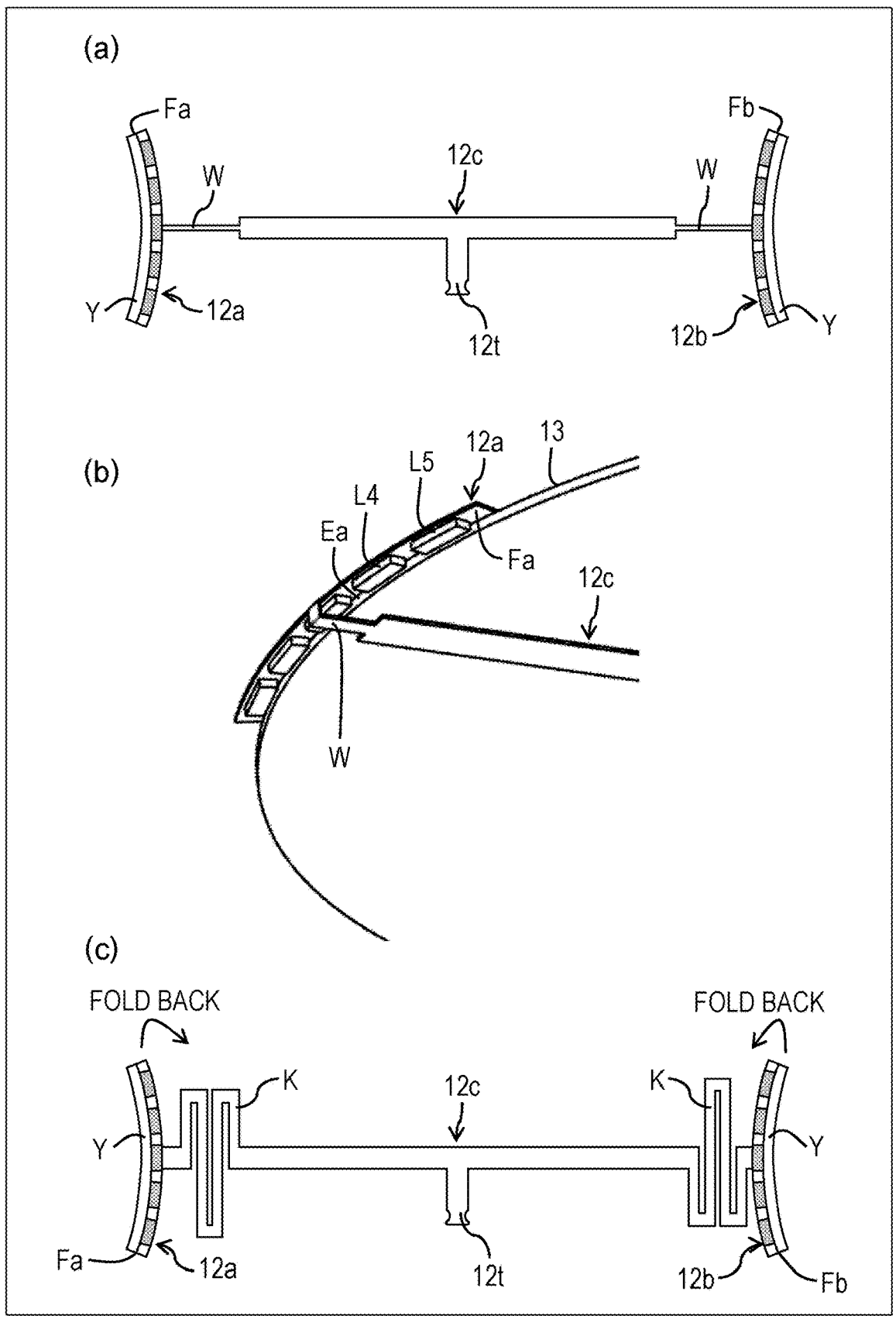
FIG. 6(a) is a top view illustrating a modification of the light-emitting device according to the second embodiment.
FIG. 6(b) is a bottom perspective view illustrating an example of attaching the light-emitting device to the light guide plate.
FIG. 6(c) is a top view illustrating another modification of the light-emitting device according to the second embodiment.
Figure 7:
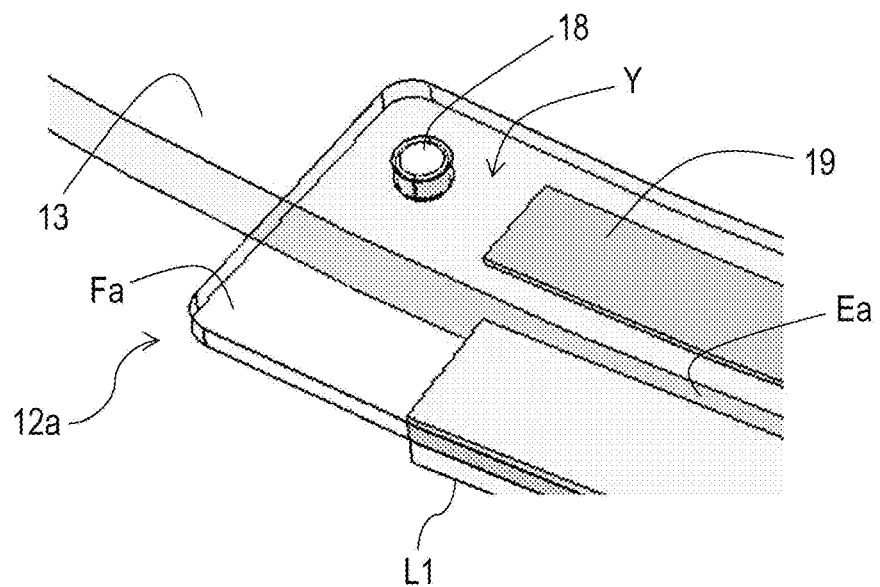
FIG. 7(a) is a bottom perspective view illustrating a technique for aligning the light guide plate and the light-emitting device according to the second embodiment.
FIG. 7(b) is a bottom perspective view for describing a technique for fixing the light guide plate and the light-emitting device according to the second embodiment.
Figure 7:
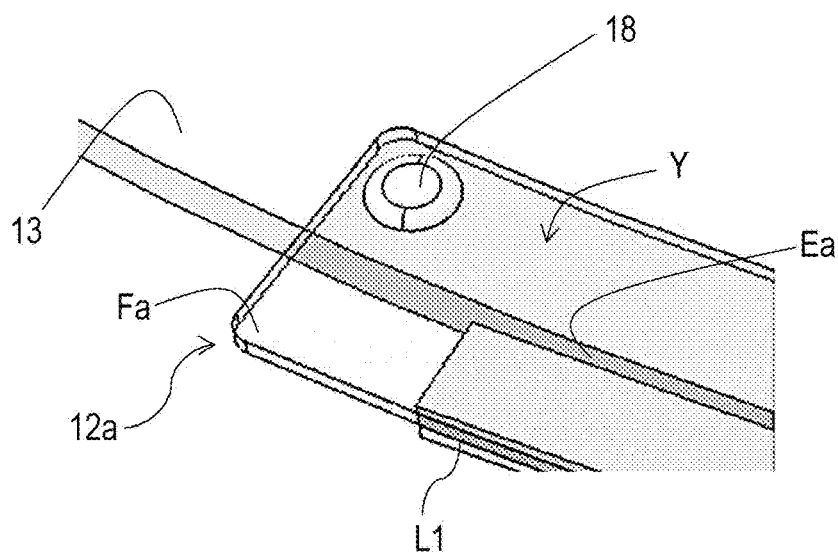

As illustrated in FIG. 1 and FIG. 2, a blank region Y in which no light-emitting element is disposed is provided in a recessed side (the side closer to the coupling portion) of each of the flexible printed circuits Fa and Fb. The blank region Y of each of the flexible printed circuits Fa and Fb is bonded to a periphery of a lower surface of the light guide plate by a bonding member 19. Thus, the light-emitting device 12 is fixed to the light guide plate 13 such that the five light-emitting elements L1 to L5 of the first light-emitting unit 12a lie along the portion Ea of the edge of the light guide plate 13 and the five light-emitting elements L6 to L10 of the second light-emitting unit 12b lie along the other portion Eb of the edge opposite to the portion Ea across the center of the light guide plate. The coupling portion 12c is disposed underneath the light guide plate 13 so as to coincide with the diameter of the lower surface of the light guide plate, and the light-reflecting sheet 14 is provided between the coupling portion 12c and the light guide plate 13.

With this configuration, light from the side surfaces of the light-emitting elements L1 to L10 (the surfaces that oppose the edge of the light guide plate 13) is guided to the upper surface of the light guide plate 13 by the light guide plate 13 and the light-reflecting sheet 14 and applied to the liquid-crystal panel 3 via the optical member 4.

According to the first embodiment, the distance from each of the light-emitting elements L1 to L5 to the portion Ea of the edge of the light guide plate and the distance from each of the light-emitting elements L6 to L10 to the other portion Eb of the edge can be reduced, and the light input efficiency from the light-emitting elements into the light guide plate can be increased. In addition, a frame region outside the light guide plate 13 can be reduced. The light input efficiency decreases along with an increase in the distance from the light-emitting surfaces of the light-emitting elements to the edge of the light guide plate.

Therefore, this distance is preferably no greater than 0.1 mm or more preferably no greater than 0.05 mm.

The elongated coupling portion 12c connects to the center portion of each of the curved flexible printed circuits Fa and Fb, and the connection terminal portion 12t is pulled out from the center portion of the coupling portion 12c. This facilitates the assembly of the lighting device 5.

FIG. 3(a) is a bottom perspective view illustrating a technique for aligning the light guide plate and the light-emitting device according to the first embodiment, FIG. 3(b) is a bottom perspective view for describing a technique for fixing the light guide plate and the light-emitting device according to the first embodiment, and FIG. 3(c) is a sectional view for describing an example of attaching the light-emitting device to the light guide plate according to the first embodiment.

As illustrated in FIG. 3(a), for example, in the first embodiment, a positioning pin (projection) 18 provided in a periphery of the lower surface of the light guide plate is fitted into a positioning hole provided in the blank region Y of the corresponding flexible printed circuit (Fa or Fb). Thus, the light guide plate 13 and the light-emitting device 12 are aligned with each other. This prevents a rotational deviation or a positional deviation of the flexible printed circuit, and the distance between the edge of the light guide plate 13 and each light-emitting element is retained constant. Thus, the light input efficiency into the light guide plate 13 can be increased. The positioning pin on the light guide plate 13 can also be used to position the diffusion sheet or the prism sheets.

As illustrated in FIG. 3(b), in the first embodiment, instead of using the bonding member, the positioning pin 18 (on the lower surface) of the light guide plate 13 may be fitted into the positioning hole in the flexible printed circuit Fa to complete the alignment, and then the positioning pin 18 may be thermally caulked to mechanically fix the flexible printed circuit Fa and the light guide plate 13. This can more reliably prevent the positional deviation between the two, and the bonding member, such as a double-sided adhesive tape, can be eliminated.

In the first embodiment, the coupling portion (flexible printed circuit) 12c of the light-emitting device 12 may have a foldable shape that is longer than the diameter of the light guide plate 13. This allows the coupling portion 12c to be folded to have its length adjusted, as illustrated in FIG. 3(c), when the flexible printed circuits Fa and Fb and the light guide plate 13 are positioned to each other, and this makes it possible to attach the light-emitting device 12 to the light guide plate 13 of various diameters while the distance between the edge of the light guide plate 13 and each light-emitting element is retained constant.

In the light-emitting device 12, the coupling portion 12c may be elastic in its lengthwise direction. This allows a flexible printed circuit 12c to be extended to have its length regulated when the flexible printed circuits Fa and Fb and the light guide plate 13 are positioned to each other, and this makes it possible to attach the light-emitting device 12 to the light guide plate 13 of various diameters while the distance between the edge of the light guide plate 13 and each light-emitting element is retained constant. In this case, silicon rubber, for example, may be used for the base material of the coupling portion 12c, or a material that shrinks upon being heated, such as PET, may be used.

When the coupling portion 12c is foldable and is also elastic in the lengthwise direction, the light-emitting device 12 can be attached to the light guide plate 13 of a greater variety of diameters while the distance between the edge of the light guide plate 13 and each light-emitting element is retained constant.

FIGS. 4(a) and 4(b) are bottom perspective views illustrating another configuration of the light-emitting device according to the first embodiment. As illustrated in FIG. 4(a), in the first embodiment, the coupling portion 12c can include a bent portion K. The bent portion K is provided, for example, in each of the side closer to the flexible printed circuit Fa and the side closer to the flexible printed circuit Fb. This allows the bent portion K of the flexible printed circuit 12c to be extended to have its length regulated when the flexible printed circuits Fa and Fb and the light guide plate 13 are positioned to each other (see FIG. 4(b)), and this makes it possible to attach the light-emitting device 12 to the light guide plate 13 of various diameters while the distance between the edge of the light guide plate 13 and each light-emitting element is retained constant.

Second Embodiment

FIG. 5(a) is a sectional view of a light-emitting device according to a second embodiment, FIG. 5(b) is a top view of the light-emitting device according to the second embodiment, and FIG. 5(c) is a bottom perspective view illustrating an example of attaching the light-emitting device to a light guide plate according to the second embodiment.

A light-emitting device 12 according to the second embodiment includes a first light-emitting unit 12a, a second light-emitting unit 12b, a coupling portion 12c, and a connection terminal portion 12t. The coupling portion 12c is disposed so as to coincide with a region SA sandwiched by the first light-emitting unit 12a and the second light-emitting unit 12b and couples the first light-emitting unit 12a and the second light-emitting unit 12b.

The first light-emitting unit 12a includes a curved flexible printed circuit Fa that projects in a first direction (the right direction in the drawings), and five light-emitting elements L1 to L5 are mounted on the projecting side (the side closer to the coupling portion) of the flexible printed circuit Fa in a circular arc shape that projects in the first direction. The second light-emitting unit 12b includes a curved flexible printed circuit Fb that projects in a second direction (the left direction in the drawings) opposite to the first direction, and five light-emitting elements L6 to L10 are mounted on the projecting side (the side closer to the coupling portion) of the flexible printed circuit Fb in a circular arc shape that projects in the second direction.

As illustrated in FIG. 5(b), in the light-emitting device 12 according to the second embodiment, each of the first and second light-emitting units 12a and 12b is curved so as to project toward the coupling portion. The light-emitting elements L1 to L5 of the first light-emitting unit 12a are arranged in a circular arc shape so as to project toward the coupling portion, and the light-emitting elements L6 to L10 of the second light-emitting unit 12b are arranged in a circular arc shape so as to project toward the coupling portion.

The coupling portion 12c is an elongated (belt-shaped) flexible printed circuit and mechanically and electrically couples the flexible printed circuit Fa and the flexible printed circuit Fb. The connection terminal portion 12t is a flexible printed circuit pulled out from the coupling portion 12c. The flexible printed circuit Fa, the flexible printed circuit Fb, the coupling portion 12c, and the connection terminal portion 12t are continuous. The connection terminal portion 12t is pulled out from a mid portion of the coupling portion 12c, but this is not a limiting example.

In the light-emitting device 12, each light-emitting element includes, for example, an LED (light-emitting diode).

The light-emitting elements L1 to L5 connected in series in the first light-emitting unit 12a are connected to the connection terminal portion 12t via the coupling portion 12c, and the light-emitting elements L6 to L10 connected in series in the second light-emitting unit 12b are connected to the connection terminal portion 12t via the coupling portion 12c.

As illustrated in FIGS. 5(a) to 5(c), in the light-emitting device 12, a blank region Y in which no light-emitting element is present is provided in a recessed side (the side farther from the coupling portion) of each of the flexible printed circuits Fa and Fb, and the light-emitting device 12 is fixed to the light guide plate by bending the coupling portion at each of the side closer to the first light-emitting unit and the side closer to the second light-emitting unit so as to vertically invert the first and second light-emitting units 12a and 12b.

Specifically, an end portion X of the coupling portion 12c is bent upward by 90 degrees, and each of the first light-emitting unit 12a and the second light-emitting unit 12b is bent at an angle of 90 degrees relative to the end portion X of the coupling portion 12c. In this state (the state in which the first and second light-emitting units 12a and 12b are vertically inverted), the blank region Y of the flexible printed circuit Fa that is located over the light-emitting elements L1 to L5 and the blank region Y of the flexible printed circuit Fb that is located over the light-emitting elements L6 to L10 are bonded to a periphery of an upper surface of the light guide plate by a bonding member 19. Thus, the light-emitting device 12 is fixed to the light guide plate 13 such that the five light-emitting elements L1 to L5 of the first light-emitting unit 12a lie along a portion Ea of an edge of the light guide plate 13 and the five light-emitting elements L6 to L10 of the second light-emitting unit 12b lie along another portion Eb of the edge opposite to the portion Ea across the center of the light guide plate. The coupling portion 12c is disposed underneath the light guide plate 13 so as to coincide with the diameter of a lower surface of the light guide plate, and a light-reflecting sheet 14 is provided between the coupling portion 12c and the light guide plate 13.

With this configuration, light from the side surfaces of the light-emitting elements L1 to L10 (the surfaces that oppose the edge of the light guide plate 13) is guided to the upper surface of the light guide plate 13 by the light guide plate 13 and the light-reflecting sheet 14 and applied to a liquid-crystal panel 3 via an optical member 4.

According to the second embodiment, the distance from each of the light-emitting elements L1 to L5 to the portion Ea of the edge of the light guide plate and the distance from each of the light-emitting elements L6 to L10 to the other portion Eb of the edge can be reduced, and the light input efficiency from the light-emitting elements into the light guide plate can be increased. In addition, a frame region outside the light guide plate 13 can be reduced. The light input efficiency decreases along with an increase in the distance from the light-emitting surfaces of the light-emitting elements to the edge of the light guide plate. Therefore, this distance is preferably no greater than 0.1 mm or more preferably no greater than 0.05 mm.

In addition, after the light-emitting device 12 is attached to the light guide plate 13, the flexible printed circuit Fa is located over the light-emitting elements L1 to L5, and the flexible printed circuit Fb is located over the light-emitting elements L6 to L10. Therefore, light from each light-emitting element is reflected by the blank region Y of the flexible printed circuit Fa or Fb as well, and the light input efficiency from the light-emitting elements into the light guide plate can be further increased.

One (the end portion X) of the two end portions of the elongated coupling portion 12c connects to the center portion of the curved flexible printed circuit Fa, the other end portion connects to the center portion of the curved flexible printed circuit Fb, and the connection terminal portion 12t is pulled out from the center portion of the coupling portion 12c. This facilitates the assembly of a lighting device 5.

The coupling portion 12c according to the second embodiment includes a bendable portion W (including the end portion X) provided at each of the side closer to the first light-emitting unit 12a and the side closer to the second light-emitting unit 12b. This bendable portion W desirably has a monolayer structure of a copper foil layer of a wiring pattern. This reduces the thickness of the bendable portion W to reduce the counterforce produced through bending and makes it possible to prevent the positional deviation of each light-emitting element relative to the light guide plate 13. No reinforcing plate or the like is provided in the bendable portion W.

FIG. 6(a) is a top view illustrating a modification of the light-emitting device according to the second embodiment, FIG. 6(b) is a bottom perspective view illustrating an example of attaching the light-emitting device to the light guide plate, and FIG. 6(c) is a top view illustrating another modification of the light-emitting device according to the second embodiment.

As illustrated in FIGS. 6(a) and 6(b), in the second embodiment, the bendable portion W can have a shape with a narrow portion. This reduces the counterforce produced through bending and suppresses the positional deviation of each light-emitting element relative to the light guide plate 13 after the lighting device 5 is assembled.

In the second embodiment, the coupling portion 12c can include a bent portion K. The bent portion K is provided, for example, in each of the side closer to the flexible printed circuit Fa and the side closer to the flexible printed circuit Fb. This allows the bent portion K of a flexible printed circuit 12c to be extended to have its length regulated when the flexible printed circuits Fa and Fb and the light guide plate 13 are positioned to each other, and this makes it possible to attach the light-emitting device 12 to the light guide plate 13 of various diameters while the distance between the edge of the light guide plate 13 and each light-emitting element is retained constant. The bent portion K may or may not include the bendable portion.

In the second embodiment, the flexible printed circuit constituting the coupling portion 12c can have a shape-retaining property (the property of retaining the shape in a bent state). This further reduces the counterforce produced through bending and suppresses the positional deviation of each light-emitting element relative to the light guide plate 13 after the lighting device 5 is assembled.

As illustrated in FIG. 7(a), in the second embodiment as well, a positioning pin (projection) 18 provided in a periphery of the upper surface of the light guide plate is fitted into a positioning hole provided in the blank region Y of the corresponding flexible printed circuit (Fa or Fb). Thus, the light guide plate 13 and the light-emitting device 12 can be aligned with each other. This prevents the rotational deviation or the positional deviation of the flexible printed circuit, and the distance between the edge of the light guide plate 13 and each light-emitting element can be retained constant. In addition, as illustrated in FIG. 7(b), instead of using the bonding member, the positioning pin 18 (on the upper surface) of the light guide plate 13 may be fitted into the positioning hole in the flexible printed circuit Fa to complete the alignment, and then the positioning pin 18 may be thermally caulked to mechanically fix the flexible printed circuit Fa and the light guide plate 13. This can more reliably prevent the positional deviation between the two, and the bonding member, such as a double-sided adhesive tape, can be eliminated.

Third Embodiment

Figure 8:
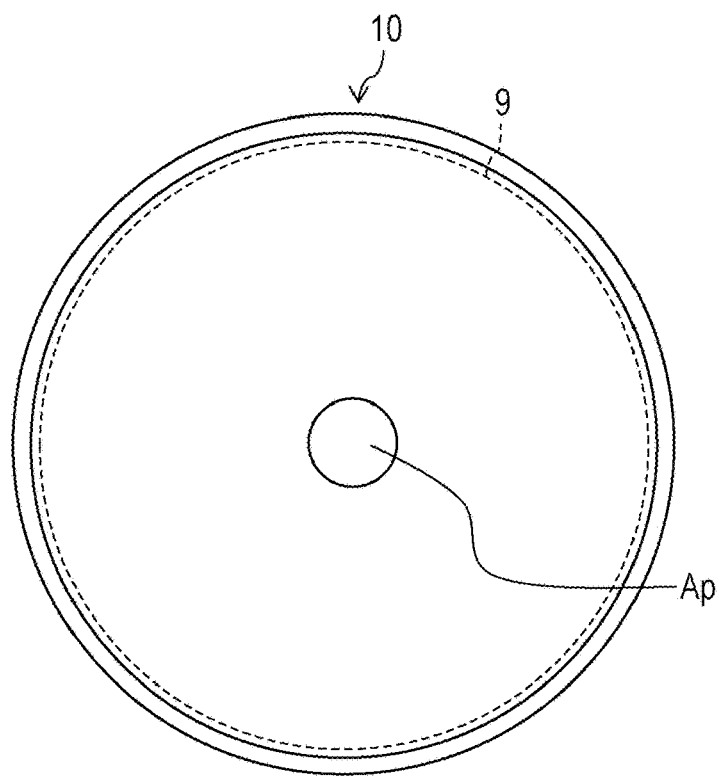
FIG. 8(a) is a top view illustrating a configuration of a liquid-crystal display device according to a third embodiment.
FIG. 8(b) is a top view of a light-emitting device according to the third embodiment.
Figure 8:
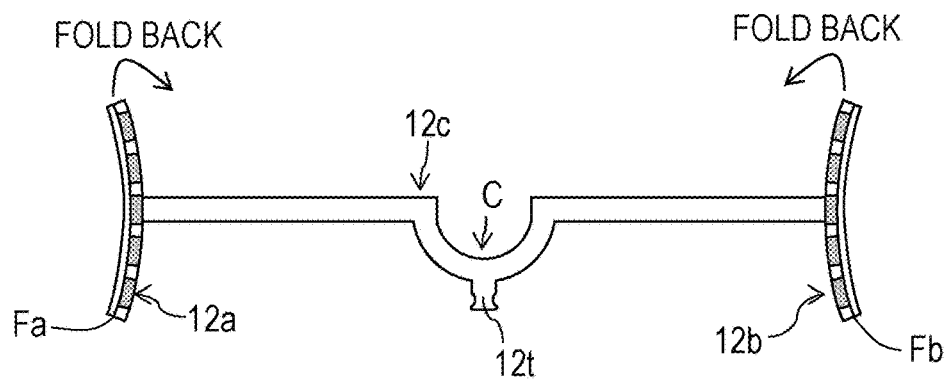

FIG. 8(*a*) is a top view illustrating a configuration of a liquid-crystal display device according to a third embodiment, and FIG. 8(*b*) is a top view of a light-emitting device according to the third embodiment.

As illustrated in FIG. 8(*a*), a liquid-crystal display device 10 includes a display unit 9 that is circular as viewed from the above, and a circular opening Ap is provided at the center portion of the display unit 9. In this case, an opening corresponding to the opening Ap is provided in a light guide plate 13 as well. There is no limitation on the shape, the position, and the number of the opening Ap.

As illustrated in FIG. 8(*b*), in a light-emitting device 12 to be used in such a liquid-crystal display device 10, a center portion of a coupling portion 12*c* is formed into a roundabout-shaped portion C, so that the coupling portion 12*c* does not overlap the opening in the light guide plate that corresponds to the opening Ap.

Concerning First to Third Embodiments

The light guide plate 13 is disc-shaped in each of the foregoing embodiments. Alternatively, the light guide plate 13 may instead be elliptical disc-shaped. In this case, the coupling portion 12*c* is disposed underneath the light guide plate 13 so as to coincide with the major axis or the minor axis of the lower surface of the light guide plate. For example, when the plurality of light-emitting elements are arranged along an elliptical arc that include both ends of the major axis, the coupling portion 12*c* is disposed so as to coincide with the major axis of the lower surface of the light guide plate. When the plurality of light-emitting elements are arranged along an elliptical arc that includes both ends of the minor axis, the coupling portion 12*c* is disposed so as to coincide with the minor axis of the lower surface of the light guide plate.

The liquid-crystal display device in which a liquid-crystal panel is used as a device for regulating the amount of transmitted light is exemplified in each of the foregoing embodiments. Alternatively, the embodiments can also be applied to a MEMS (Micro Electro Mechanical Systems) display in which MEMS is used as a device for regulating the amount of transmitted light (optical shutter).

A light-emitting device according to one aspect of the present invention includes a first light-emitting unit that includes a plurality of light-emitting elements arranged curvilinearly, a second light-emitting unit that includes a plurality of light-emitting elements arranged curvilinearly, and a coupling portion that is disposed so as to coincide with a region sandwiched by the first and second light-emitting units and couples the first and second light-emitting units.

In another aspect, the plurality of light-emitting elements of the first light-emitting unit may be disposed in a circular arc shape or an elliptical arc shape that projects in a first direction, and the plurality of light-emitting elements of the second light-emitting unit may be disposed in a circular arc shape or an elliptical arc shape that projects in a second direction opposite to the first direction.

In another aspect, the coupling portion may be flexible.

In another aspect, the coupling portion may be foldable.

In another aspect, the coupling portion may be elastic.

In another aspect, the coupling portion may include a bent shape portion.

In another aspect, the coupling portion may include a bendable portion in each of a side closer to the first light-emitting unit and a side closer to the second light-emitting unit, the bendable portion in the side closer to the first light-emitting unit may be bent to allow the first light-emitting unit to be inverted, and the bendable portion in the side closer to the second light-emitting unit may be bent to allow the second light-emitting unit to be inverted.

In another aspect, each of the bendable portion in the side closer to the first light-emitting unit and the bendable portion in the side closer to the second light-emitting unit may be thinner than the remaining portion.

In another aspect, each of the bendable portion in the side closer to the first light-emitting unit and the bendable portion in the side closer to the second light-emitting unit may have a shape-retaining property.

In another aspect, each of the bendable portion in the side closer to the first light-emitting unit and the bendable portion in the side closer to the second light-emitting unit may have a shape with a narrow portion.

In another aspect, the plurality of light-emitting elements of each of the first and second light-emitting units may be disposed curvilinearly so as to project toward the coupling portion.

In another aspect, the coupling portion may be constituted by an elongated flexible printed circuit.

In another aspect of the present invention, each of the first and second light-emitting units may include a curved flexible printed circuit that connects to the coupling portion and a plurality of light-emitting elements mounted on a projecting side of the flexible printed circuit.

A lighting device according to one aspect of the present invention includes a disc-shaped or elliptical disc-shaped light guide plate and the light-emitting device of the foregoing aspects that is fixed to the light guide plate such that the plurality of light-emitting elements of the first light-emitting unit lie along a portion of an edge of the light guide plate and the plurality of light-emitting elements of the second light-emitting unit lie along another portion of the edge opposite to the aforementioned portion across a center of the light guide plate.

In another aspect, with a light-exit side of the light guide plate regarded as an upper side, the coupling portion may be disposed underneath the light guide plate so as to coincide with a diameter or a major axis of a lower surface of the light guide plate.

In another aspect, a light-reflecting member may be provided between the light guide plate and the coupling portion of the light-emitting device.

In another aspect, with a light-exit side of the light guide plate regarded as an upper side, the flexible printed circuit of each of the first and second light-emitting units may include a blank region in which no light-emitting element is present in a recessed side of the flexible printed circuit, and the blank region may be used to fix the flexible printed circuit to an upper surface of the light guide plate.

In another aspect, the coupling portion may be bent at each of the side closer to the first light-emitting unit and the side closer to the second light-emitting unit, and the flexible printed circuit may be located over each light-emitting element.

In another aspect, a projection for positioning may be provided on the upper surface of the light guide plate, and a hole corresponding to the projection may be provided in the blank region.

In another aspect, an opening may be formed in the light guide plate.

In another aspect, the coupling portion of the light-emitting device may include a roundabout-shaped portion that detours around the opening.

A display device according to one aspect of the present invention includes the light-emitting device of the foregoing aspects.

The present invention is not limited to the embodiments described above, and an embodiment obtained by combining the technical means disclosed in different embodiments as appropriate is also encompassed by the technical scope of the present invention. Furthermore, a new technical feature can be formed by combining the technical means disclosed in the embodiments.

REFERENCE SIGNS LIST

3 LIQUID-CRYSTAL PANEL
5 LIGHTING DEVICE
9 DISPLAY UNIT
10 LIQUID-CRYSTAL DISPLAY DEVICE
12 LIGHT-EMITTING DEVICE
12a FIRST LIGHT-EMITTING UNIT
12b SECOND LIGHT-EMITTING UNIT
12c COUPLING PORTION (FLEXIBLE PRINTED CIRCUIT)
12t CONNECTION TERMINAL PORTION (FLEXIBLE PRINTED CIRCUIT)
13 LIGHT GUIDE PLATE
14 LIGHT-REFLECTING SHEET
Fa, Fb FLEXIBLE PRINTED CIRCUIT
L1 to L10 LIGHT-EMITTING ELEMENT
Ea, Eb PORTION OF EDGE OF LIGHT GUIDE PLATE
K BENT PORTION
W BENDABLE PORTION
Y BLANK REGION
C ROUNDABOUT-SHAPED PORTION

The invention claimed is:

1. A light-emitting device, comprising:
a first light-emitting unit that includes a plurality of light-emitting elements arranged curvilinearly;
a second light-emitting unit that includes a plurality of light-emitting elements arranged curvilinearly; and
a coupling portion that is disposed so as to coincide with a region sandwiched by the first and second light-emitting units and couples the first and second light-emitting units;
wherein
the coupling portion includes a bendable portion in each of a side closer to the first light-emitting unit and a side closer to the second light-emitting unit, the bendable portion in the side closer to the first light-emitting unit is folded to allow the first light-emitting unit to be inverted, and the bendable portion in the side closer to the second light-emitting unit is folded to allow the second light-emitting unit to be inverted.

2. The light-emitting device according to claim 1, wherein the plurality of light-emitting elements of the first light-emitting unit are disposed in a circular arc shape or an elliptical arc shape that projects in a first direction, and the plurality of light-emitting elements of the second light-emitting unit are disposed in a circular arc shape or an elliptical arc shape that projects in a second direction opposite to the first direction.

3. The light-emitting device according to claim 1, wherein the coupling portion is flexible.

4. The light-emitting device according to claim 3, wherein the coupling portion is foldable.

5. The light-emitting device according to claim 3, wherein the coupling portion is elastic.

6. The light-emitting device according to claim 1, wherein the coupling portion includes a bent shape portion.

7. The light-emitting device according to claim 1, wherein each of the bendable portion in the side closer to the first light-emitting unit and the bendable portion in the side closer to the second light-emitting unit is thinner than a remaining portion.

8. The light-emitting device according to claim 1, wherein each of the bendable portion in the side closer to the first light-emitting unit and the bendable portion in the side closer to the second light-emitting unit has a shape-retaining property.

9. The light-emitting device according to claim 1, wherein each of the bendable portion in the side closer to the first light-emitting unit and the bendable portion in the side closer to the second light-emitting unit has a shape with a narrow portion.

10. The light-emitting device according to claim 1, wherein the plurality of light-emitting elements of each of the first and second light-emitting units are disposed curvilinearly so as to project toward the coupling portion.

11. The light-emitting device according to claim 1, wherein the coupling portion is constituted by an elongated flexible printed circuit.

12. The light-emitting device according to claim 11, wherein each of the first and second light-emitting units includes a curved flexible printed circuit that connects to the coupling portion and a plurality of light-emitting elements mounted on a projecting side of the flexible printed circuit.

13. A lighting device, comprising:
a disc-shaped or elliptical disc-shaped light guide plate; and
the light-emitting device according to claim 12 that is fixed to the light guide plate such that the plurality of light-emitting elements of the first light-emitting unit lie along a portion of an edge of the light guide plate and the plurality of light-emitting elements of the second light-emitting unit lie along another portion of the edge opposite to the portion across a center of the light guide plate.

14. The lighting device according to claim 13, wherein with a light-exit side of the light guide plate regarded as an upper side,
the coupling portion is disposed underneath the light guide plate so as to coincide with a diameter or a major axis of a lower surface of the light guide plate.

15. The lighting device according to claim 14, wherein a light-reflecting member is provided between the light guide plate and the coupling portion of the light-emitting device.

16. The lighting device according to claim 13, wherein with a light-exit side of the light guide plate regarded as an upper side,
the flexible printed circuit of each of the first and second light-emitting units includes a blank region in which no light-emitting element is present in a recessed side of the flexible printed circuit, and the blank region is used to fix the flexible printed circuit to an upper surface of the light guide plate.

17. The lighting device according to claim 13, wherein an opening is formed in the light guide plate.

18. The lighting device according to claim 17, wherein the coupling portion of the light-emitting device includes a roundabout-shaped portion that detours around the opening.

19. A display device, comprising:
the light-emitting device according to claim 1.

20. A lighting device, comprising:
a light-emitting device; and
a disc-shaped or elliptical disc-shaped light guide plate; wherein
the light-emitting device includes:
a first light-emitting unit that includes a plurality of light-emitting elements arranged curvilinearly;
a second light-emitting unit that includes a plurality of light-emitting elements arranged curvilinearly; and
a coupling portion that is disposed so as to coincide with a region sandwiched by the first and second light-emitting units and couples the first and second light-emitting units;
the coupling portion is constituted by an elongated flexible printed circuit;
each of the first and second light-emitting units includes a curved flexible printed circuit that connects to the coupling portion and a plurality of light-emitting elements mounted on a projecting side of the flexible printed circuit; and
the light-emitting device is fixed to the light guide plate such that the plurality of light-emitting elements of the first light-emitting unit lie along a portion of an edge of the light guide plate and the plurality of light-emitting elements of the second light-emitting unit lie along another portion of the edge opposite to the portion across a center of the light guide plate;
a light-exit side of the light guide plate is regarded as an upper side;
the flexible printed circuit of each of the first and second light-emitting units includes a blank region in which no light-emitting element is present in a recessed side of the flexible printed circuit, and the blank region is used to fix the flexible printed circuit to an upper surface of the light guide plate; and
the coupling portion is bent at each of the side closer to the first light-emitting unit and the side closer to the second light-emitting unit, and the flexible printed circuit is located over each light-emitting element.

21. A lighting device, comprising:
a light-emitting device; and
a disc-shaped or elliptical disc-shaped light guide plate; wherein
the light-emitting device includes:
a first light-emitting unit that includes a plurality of light-emitting elements arranged curvilinearly;
a second light-emitting unit that includes a plurality of light-emitting elements arranged curvilinearly; and
a coupling portion that is disposed so as to coincide with a region sandwiched by the first and second light-emitting units and couples the first and second light-emitting units;
the coupling portion is constituted by an elongated flexible printed circuit;
each of the first and second light-emitting units includes a curved flexible printed circuit that connects to the coupling portion and a plurality of light-emitting elements mounted on a projecting side of the flexible printed circuit; and
the light-emitting device is fixed to the light guide plate such that the plurality of light-emitting elements of the first light-emitting unit lie along a portion of an edge of the light guide plate and the plurality of light-emitting elements of the second light-emitting unit lie along another portion of the edge opposite to the portion across a center of the light guide plate;
a light-exit side of the light guide plate is regarded as an upper side;
the flexible printed circuit of each of the first and second light-emitting units includes a blank region in which no light-emitting element is present in a recessed side of the flexible printed circuit, and the blank region is used to fix the flexible printed circuit to an upper surface of the light guide plate; and
a projection for positioning is provided on the upper surface of the light guide plate, and a hole corresponding to the projection is provided in the blank region.

* * * * *